(12) United States Patent
Takahashi

(10) Patent No.: US 7,120,042 B2
(45) Date of Patent: Oct. 10, 2006

(54) FERROELECTRIC MEMORY DEVICE HAVING TEST MEMORY CELL

(75) Inventor: Kazuhiko Takahashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 23 days.

(21) Appl. No.: 10/768,184

(22) Filed: Feb. 2, 2004

(65) Prior Publication Data
US 2004/0190325 A1 Sep. 30, 2004

(30) Foreign Application Priority Data
Jan. 31, 2003 (JP) .............................. 2003-024514

(51) Int. Cl.
*G11C 11/22* (2006.01)
*G11C 11/42* (2006.01)
*G11C 7/10* (2006.01)
*G11C 7/02* (2006.01)
*G11C 7/00* (2006.01)
*G11C 29/00* (2006.01)
*G11C 8/00* (2006.01)

(52) U.S. Cl. .................... 365/145; 365/65; 365/189.08; 365/200; 365/201; 365/207; 365/210; 365/230.06

(58) Field of Classification Search ................. 365/145, 365/200, 201, 207, 210
See application file for complete search history.

(56) References Cited

U.S. PATENT DOCUMENTS

| 5,751,628 A * | 5/1998 | Hirano et al. ............... 365/145 |
| 6,078,529 A * | 6/2000 | Tada ..................... 365/189.07 |
| 6,363,002 B1 * | 3/2002 | Nishimura et al. ......... 365/145 |
| 6,501,674 B1 * | 12/2002 | Ashikaga .................... 365/145 |
| 6,560,137 B1 * | 5/2003 | Allen et al. ................ 365/145 |
| 6,721,200 B1 * | 4/2004 | Nishimura et al. ......... 365/145 |
| 2004/0017704 A1 * | 1/2004 | Yamaoka et al. ........... 365/200 |

FOREIGN PATENT DOCUMENTS

JP        10-144091        5/1998

\* cited by examiner

*Primary Examiner*—Amir Zarabian
*Assistant Examiner*—Ly Duy Pham
(74) *Attorney, Agent, or Firm*—VolentineFrancos&Whitt,PLLC

(57) ABSTRACT

A ferroelectric memory device includes a bit line pair, a plurality of memory cells which include one transistor and one ferroelectric capacitor, and a plurality of judgement memory cells which include two transistors and two ferroelectric capacitors. Each of the memory cells is connected to one of the bit lines of the bit line pair, and each of the judgement memory cells is connected to both of the bit lines of the bit line pair.

12 Claims, 10 Drawing Sheets

FERROELECTRIC MEMORY DEVICE HAVING TEST MEMORY CELL

CROSS REFERENCE TO RELATED APPLICATION

A claim of priority under 35 U.S.C. §119 is made to Japanese Patent Application No. 2003-024514, filed Jan. 31, 2003, which is herein incorporated by reference in its entirety for all purposes.

BACKGROUND OF THE INVENTION

1. Field of the Invention

The present invention relates to a ferroelectric memory device having a test memory cell.

2. Description of the Related Art

A FeRAM (ferroelectric random access memory) is a known type of semiconductor memory. The FeRAM uses a function of the ferroelectric layer for reversing an electric field by an intrinsic polarization and for retaining the electric field. A structure of the ferroelectric memory device is shown in the Japanese language references K. Shimizu: "Low-power High-speed LSI Circuits & Technology" Realize Co., Ltd., Inc. p 231–250 Jan. 31, 1998 and T. Kawai: "Non-volatility IC memory—All the FRAMs" Kogyo Chosakai Co., Ltd., Inc. p 29–37 Jul. 7, 1996. A 1T/1C type ferroelectric memory device and a 2T/2C type ferroelectric memory device are known as shown in these references.

In the 1T/1C type ferroelectric memory device, one transistor and one ferroelectric capacitor form one memory cell. A stored data in the memory cell is read by comparing between a stored voltage and a reference voltage.

In the 2T/2C type ferroelectric memory device, two transistors and two ferroelectric capacitors form one memory cell. Each capacitor stores complementary data of "1" or "0" respectively. A stored data in the memory cell is read by comparing the voltage of the ferroelectric capacitors.

An operation test of a semiconductor memory device is known in which a determination is made as to whether the memory device can store data of "1" and "0" correctly. In this operation test, the testing equipment writes testing data to all the memory cells, and then the written data is read from all the memory cells. The test is performed by comparing the testing data and the written data.

Recently, high-capacity ferroelectric memory devices have been developed in which the number of memory cells included in one ferroelectric memory chip is increased. If the ferroelectric memory chip includes at least one defective cell, the ferroelectric memory chip is judged as a defective product. As a result, increasing a number of the memory cells in the ferroelectric memory device decreases productivity.

A technique using redundancy memory cells for increasing productivity is known. In this technique, a redundancy memory array is added to the memory cell array. In the ferroelectric memory device with the redundancy memory cells, if the ferroelectric memory device includes a defective cell, a memory cell column (or a memory cell row) which includes the defective cell is changed to a redundancy memory cell column (or a redundancy memory cell row) in the redundancy memory cell array. As a result, the ferroelectric memory device which includes the defective memory cell can be shipped as a non-defective product.

However, adding the redundancy memory cell array causes an increase in the number of the memory cells in the ferroelectric memory chip. Therefore, the testing time for testing the ferroelectric memory cells is increased.

Further, in the operating test for changing the defective memory cell array to the redundancy memory cell array, it is necessary to detect an address of the defective memory cell. Therefore, the conventional testing equipment for the ferroelectric memory device must store a lot of test results and detect the address of the defective memory cell from the test results. As a result, the structure and the control of the testing equipment for the ferroelectric memory device are complicated and price of the testing equipment is high.

A technique for detecting the address of a defective DRAM memory cell is described in Japanese Patent Laid-Open No 10-144091. The reference describes using a refresh feature of the DRAM. However, the FRAM does not have a refresh feature, and therefore, it is difficult to apply this technique to the FRAM.

SUMMARY OF THE INVENTION

Accordingly, in one aspect of the present invention, a ferroelectric memory device can be tested with low cost and high speed is provided. The ferroelectric memory device comprising a bit line pair, a plurality of memory cells which includes one transistor and one ferroelectric capacitor and a plurality of judgment memory cells which includes two transistor and two ferroelectric capacitor. Each of the memory cell is selectively connected to one bit line and each of the judgment memory cell is connected both of the bit lines of the bit line pair.

DETAILED DESCRIPTION OF THE PREFERRED EMBODIMENTS

Figure 1:
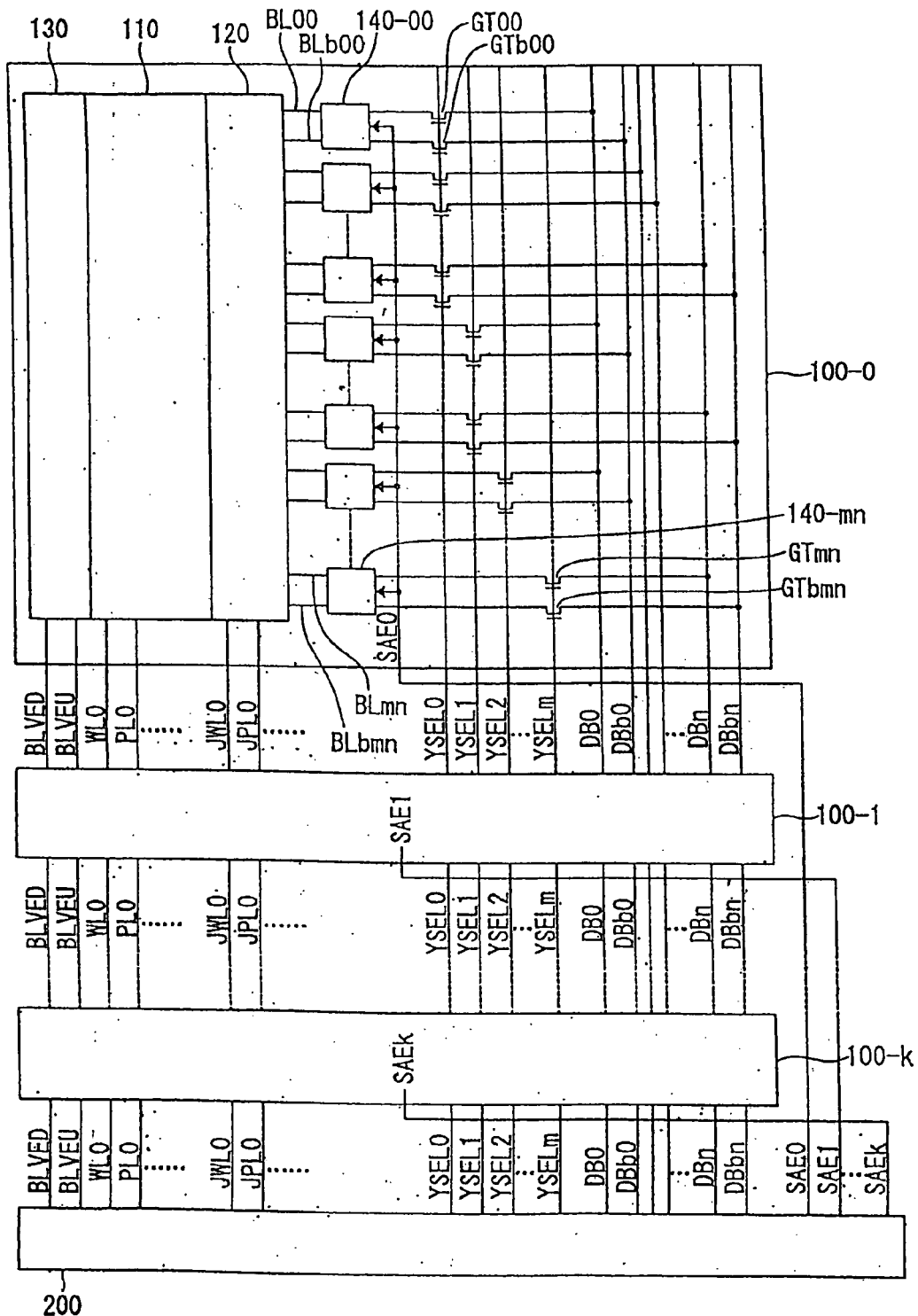
FIG. 1 is a schematic diagram showing a ferroelectric memory circuit of a first embodiment of the present invention.

Ferroelectric memory devices according to preferred embodiments of the present invention will be explained hereinafter with reference to the accompanying figures. In order to simplify the explanation, like elements are given like or corresponding reference numerals. Dual explanations of the same elements are avoided.

First Preferred Embodiment

Figure 2:
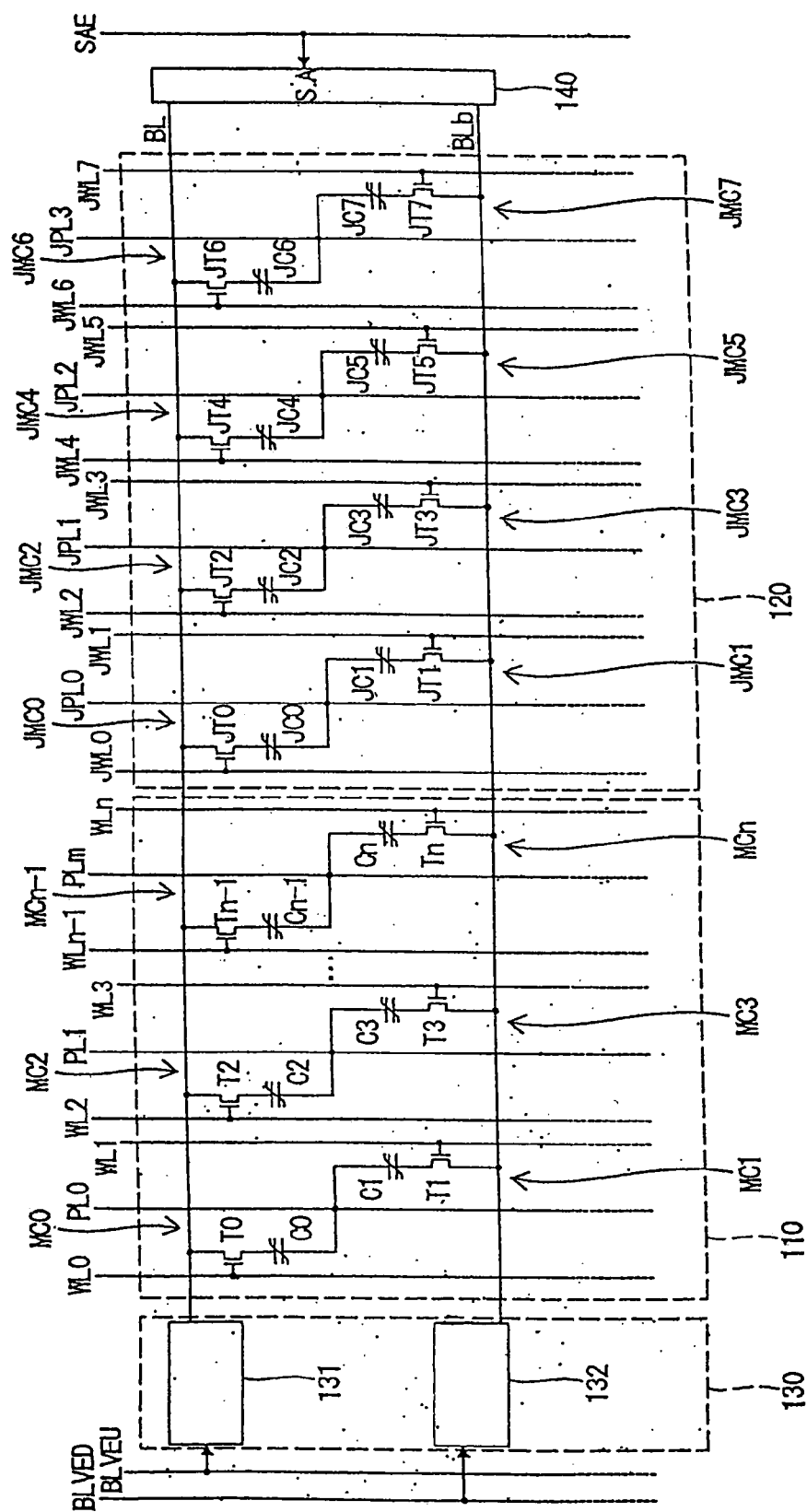
FIG. 2 is a schematic diagram showing a memory cell array block of the first embodiment of the present invention.

FIG. 1 is a schematic diagram showing a ferroelectric memory circuit of a first embodiment of the present invention. FIG. 2 is a schematic diagram showing a memory cell array block 100 of the first embodiment of the present invention.

The ferroelectric memory device includes k+1 array blocks 100-0 to 100-k, an array control circuit 200, word lines WL0 to WLn, plate lines PL0 to PLm, judgment word lines JWL0 to JWL7, judgment plate lines JPL0 to JPL3, reference voltage control lines BLVEU and BLVED, gate control lines YSEL0 to YSELm, sense amplifier control lines SAE0 to SAEk, and complementary digit line pairs DB0 to DBn and DBb0 to DBbn.

Each of the array blocks 100-0 to 100-k includes a memory cell portion 110, a judgment memory cell portion 120, a reference voltage generating circuit 130, sense amplifiers 140-00 to 140-mn, complementary bit line pairs BL00 to BLmn and BLb00 to BLbmn, and gate transistors GT00 to GTmn and GTb00 to GTbmn.

The memory cell portion 110 includes n+1 transistors T0 to Tn and n+1 ferroelectric capacitors C0 to Cn. One transistor and one ferroelectric capacitor form one memory cell. That is, the n+1 transistors T0 to Tn and the n+1 ferroelectric capacitors form the n+1 memory cells MC0 to MCn. A gate of the transistors T0 to Tn is connected to the corresponding word lines WL0 to WLn. One end of the transistors T0 to Tn is connected to one end of the, ferroelectric capacitors C0 to Cn, respectively. The other end of the ferroelectric capacitors C0 to Cn is connected to the corresponding plate lines PL0 to PLm. The other end of the transistors referred to by even numbers T0, T2, . . . , Tn−1 is connected to the bit line BL, and the other end of the transistors referred to by odd number T1, T3, . . . , Tn is connected to the bit line BLb.

The judgment memory cell portion 120 includes eight transistors JT0 to JT7 and eight ferroelectric capacitors JC0 to JC7. One transistor and one ferroelectric capacitor form one memory cell. That is, the eight transistors JT0 to JT7 and the eight ferroelectric capacitors JC0 to JC7 form the eight memory cells JMC0 to JMC7. A gate of the transistors JT0 to JT7 is connected to the corresponding judgment word lines JWL0 to JWL7. One end of the transistors JT0 to JT7 is connected to one end of the ferroelectric capacitors JC0 to JC7, respectively. The other end of the ferroelectric capacitors JC0 to JC7 is connected to the corresponding judgment plate line JPL0 to JPL3. The other end of the transistors referred to by even number JT0, JT2, JT4 and JT6 is connected to the bit line BL, and the other end of the transistors referred to by odd number JT1, JT3, JT5 and JT7 is connected to the bit line BLb. The judgment word line JWL0 is applied with a same level to the judgment word line JWL1. As a result, two 1T/1C type judgment memory cells JMC0 and JMC1 are operated as one 2T/2C type memory cell. Also, the judgment word lines JWL2, JWL4 and JWL6 are applied with the same level to the judgment word lines JWL3, JWL5 and JWL7. Therefore, each pair of the judgment memory cells JMC2 and JMC3, JMC4 and JMC5, and JMC6 and JMC7 are operated as 2T/2C type memory cells respectively.

The complementary bit line pair BL and BLb is formed at every row of the memory cells in the memory cell portion 110 and the judgment memory cell portion 120.

The word lines WL0 to WLn are formed at every column of the memory cells in the memory cell portion 110.

The plate line PL0 to PLm are formed at every word line pair and are arranged in parallel to the each word lines. Therefore, the number of plate lines is one half of the number of the word lines.

The judgment word lines JWL0 to JWL7 are formed at every column of the judgment memory cells. The adjacent word lines form a judgment word line pair.

The judgment plate lines JPL0 to JPL3 are formed at every judgment word line pair and are arranged in parallel to the each judgment word lines.

A reference voltage generating portion 130 includes reference voltage generating circuit 131 and 132. The reference voltage generating circuit 131 supplies a reference voltage Vref to the bit line when a level of the control line BLVEU is high. The reference voltage generating circuit 132 supplies the reference voltage Vref to the bit line BLb when a level of the control line BLVED is high.

The sense amplifiers 140-00 to 140 mn have input thereto a voltage of the bit lines BL and BLb when a level of the control line SAE0 to SAEk are high, and compare these voltages. Then, the sense amplifier supplies a high level to the bit line which has a higher voltage and supplies a low level to the bit line which has a lower voltage. Also, the sense amplifiers output the high level and the low level to the digit lines DB and DBb through the gate transistors GT and GTb.

The gate transistors GT00 to GTmn and GTh00 to GThmn are used for transmitting the voltage outputted from the sense amplifies 140-00 to 140mn to the complementary digit line pairs DB0 to DBn and DBb0 to DBbn. The gate transistors GT00 to GTmn and GTb00 to GTbmn are controlled by the gate control lines YSEL0 to YSELm.

The array control portion 200 controls each of the array blocks 100-0 to 100-k by using the word lines WL0 to WLn, the plate lines PL0 to PLm, the judgment word lines JWL0 to JWL7, the judgment plate lines JPL0 to JPL3, the reference voltage control lines BLVEU and BLVED, and the gate control lines YSEL0 to YSELm.

Figure 3:
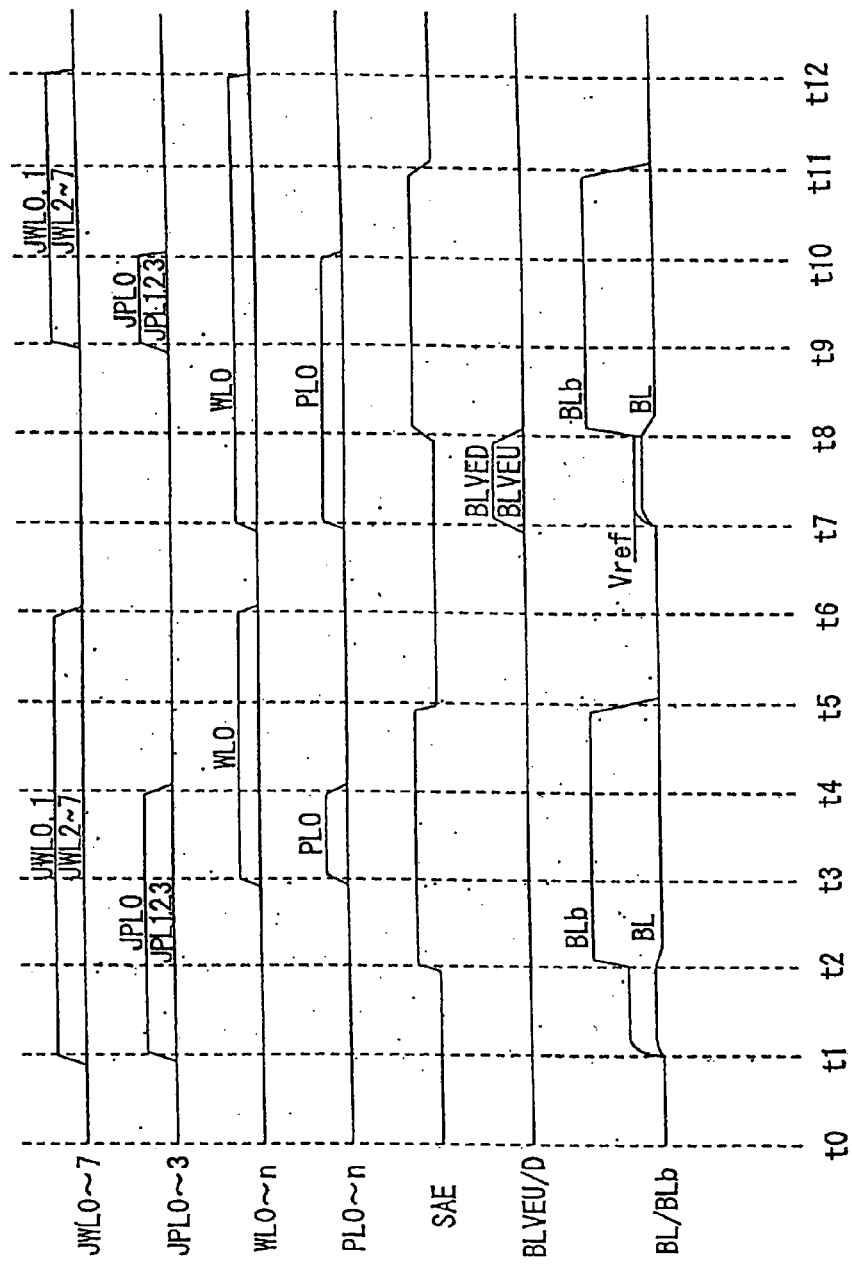
FIG. 3 is a timing chart showing a redundancy test operation of the ferroelectric memory device of the first embodiment.
Figure 4:
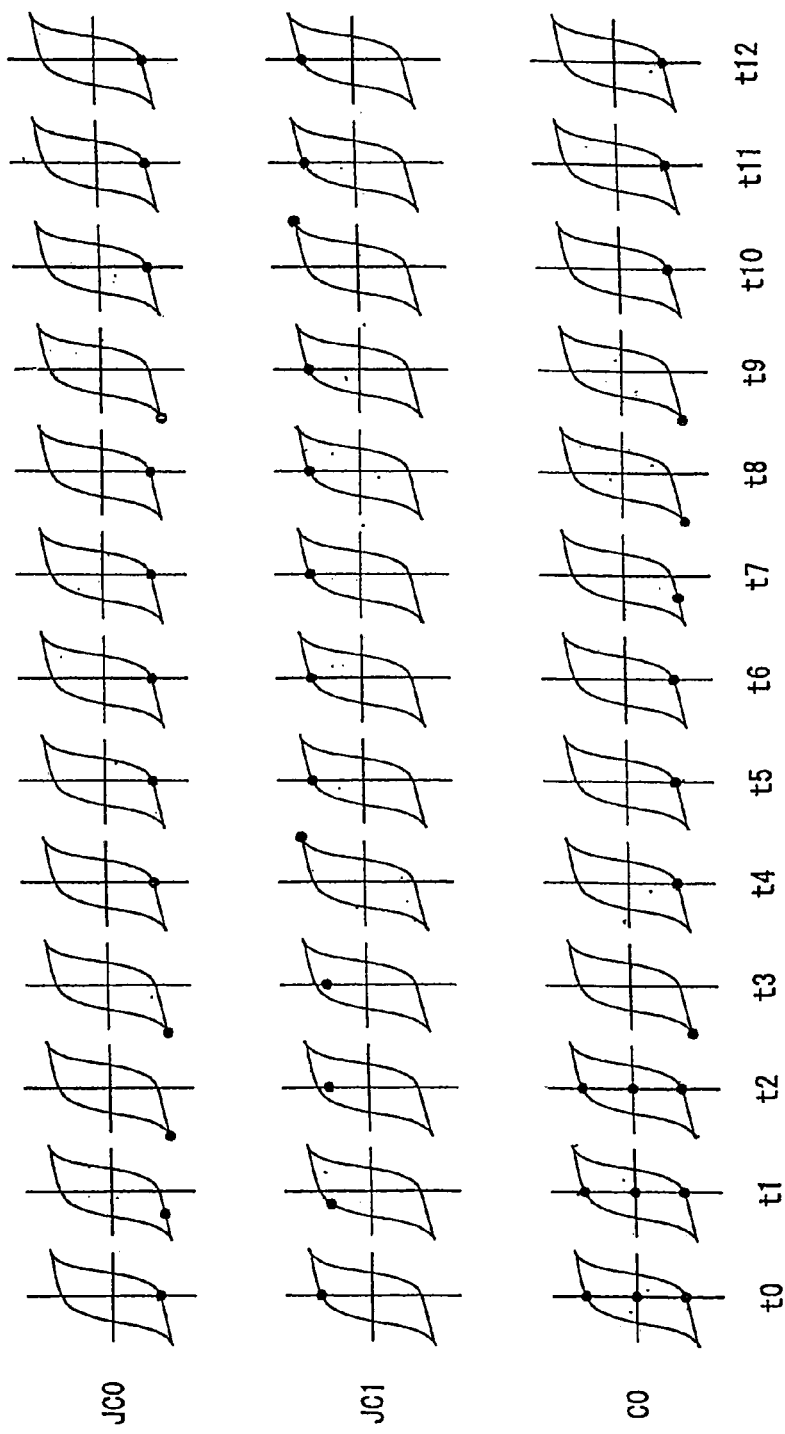
FIG. 4 is a conceptual diagram showing a polarization condition of a ferroelectric capacitor.

Next, a redundancy test operation for the memory cells MC0 to MCn is described using FIG. 3 and FIG. 4. FIG. 3 is a timing chart showing a redundancy test operation of the ferroelectric memory device of the first embodiment. FIG. 4 is a conceptual diagram showing a polarization condition of ferroelectric capacitors JC0, JC1 and C0.

In this test, the judgment data are preset in the judgment memory cells JMC0 to JMC7 as shown in FIG. 3 and FIG. 4 at t0. In this embodiment, a "0" value is written in the judgment memory cells JMC0, JMC3, JMC5 and JMC6, and a "1" value is written in the judgment memory cells JMC1, JMC2, JMC4 and JMC7. An initial data in the ferroelectric capacitor C0 is not determined.

First, the "0" value stored in the judgment memory cell JMC0 is written to the memory cell MC0 as follows.

The array control circuit 200 turns the judgment word lines JWL0 and JWL1 and the judgment plate line JPL0 to the high level at t1 simultaneously. Since the "0" value is stored in the judgment memory cell JMC0 and the "1" value is stored in the judgment memory cell JMC1, the level of the bit line BL becomes the low level and the level of the bit line BLb becomes the high level.

The array control circuit 200 turns the control line SAE to the high level at t2. The sense amplifier 140 compares a voltage between the bit line BL and the bit line BLb. Then the sense amplifier 140 supplies the high level to one bit line which has higher level (the bit line BLb in this embodiment) and the low level to the other bit line which has lower level (the bit line BL in this embodiment). Since the gate transistors GT and the Gtb are turned off, the sense amplifier 140 does not output the voltage to the digit lines DB and DBb. The judgment plate line JPL0 has the high level at t2. Therefore, the "0" value is rewritten in the judgment ferroelectric capacitor JC0 based on the voltage between the judgment plate line JPL0 and the bit line BL. Since the bit line BLb becomes the high level, the judgment ferroelectric capacitor JC1 is not rewritten.

The array control circuit 200 turns the word line WL0 and the plate line PL0 to the high level at t3. The transistor T0 turns on in response to the high level of the word line WL0. Since the bit line BL has the low level and the plate line PL0 has the high level, the "0" value is written in the memory cell MC0. Since the word lines WL1 to WLn have the low level, any data is not written in the ferroelectric capacitors C1 to Cn.

The array control circuit 200 turns the plate line PL0 and the judgement plate line JPL0 to the low level at t4. When the plate line PL0 becomes the low level and the bit line BL and the plate line PL0 become the same voltage level, the writing operation to the ferroelectric capacitor C0 is completed. Also, since the bit line BL and the judgement plate line JPL0 become the same voltage level, the writing operation to the ferroelectric capacitor JC0 is completed. Since there is a voltage between the bit line BLb and the judgement plate line JPL0, the "1" value is rewritten in the ferroelectric capacitor JC1.

The array control circuit 200 turns the control line SAE to the low level at t5. As a result, the sense amplifier 140 is stopped and the bit lines BL and BLb become the low level. The rewriting operation to the ferroelectric capacitor JC1 is completed.

The array control circuit 200 turns the word line WL0 and the judgment word lines JWL0 and JWL1 to the low level at t6. As a result, all the writing operation for writing the "0" value to the ferroelectric capacitor C0 is completed.

Then, the data "0" stored in the memory cell MC0 is written to the judgment memory cell JMC0 as shown in FIG. 3 and FIG. 4 at t7 to t12.

First, the array control circuit 200 turns the word line WL0, the plate line PL0 and the control line BLVED to the high level at t7. When the word line WL0 and the plate line PL0 become the high level, a voltage based on the polarization of the ferroelectric capacitor C0 is outputted to the bit line BL. Accordingly, the control line BLVED becomes the high level, the reference voltage generating circuit 132 outputs the reference voltage Vref to the bit line BLb. The reference voltage Vref has a middle level that is a level between the high level and the low level.

The array control circuit 200 turns the control line BLVED to the low level and the control line SAE to the high level at t8. The reference voltage generating circuit 132 stops outputting the reference voltage Vref, and the sense amplifier 140 begins the operation. The sense amplifier 140 compares the voltage between the bit line BL and the bit line BLb, and supplies the high level to one bit line which has the higher level (the BLb in this embodiment) and supplies the low level to the other bit line which has the lower level (the BL in this embodiment). When the bit line BL becomes the low level, the rewriting operation for rewriting the "0" value to the ferroelectric capacitor C0 begins based on the voltage between the plate line PL0 and the bit line BL. Since the word lines WL1 to WLn are the low level, any data is not written to the other ferroelectric capacitors C1 to Cn.

The array control circuit 200 turns the judgment word lines JWL0, JWL1 and the judgment plate line JPL0 to the high level at t9. Since the judgment plate line JPL0 has the high level, the "0" value is written to the judgment ferroelectric capacitor JC0.

The array control circuit 200 turns the plate line PL0 and the judgment plate line JPL0 to the low level. Since the plate line PL0 becomes the low level, the rewriting operation to the ferroelectric capacitor C0 is completed. Also, since the judgment plate line JPL0 becomes the low level, the writing operation to the judgment ferroelectric capacitor JC0 is completed and the writing operation of the "1" value to the judgment ferroelectric capacitor JC1 is begun.

The array control circuit 200 turns the control line SAE to the low level at t11. The operation of the sense amplifier 140 is stopped and the level of the bit lines BL and BLb become the low level. As a result, the writing operation to the ferroelectric capacitor JC1 is completed.

The array control circuit 20 turns the word line WL0 and the judgement word lines JWL0 and JWL1 to the low level at t12. As a result, all the writing operation to the judgement ferroelectric capacitors JC0 and JC1 is completed.

In this embodiment, the data "0" stored in the judgment memory cell JMC0 is written to the memory cell MC0, then the data "0" stored in the memory cell MC0 is written to the judgment memory cell JMC0 again.

Then, the array control circuit 200 performs the same operation as the t1 to t12 to the memory cells referred by even number MC2, MC4, . . . , MCn-1. That is, the "0" value data stored in the judgment memory cell JMC0 is written in the order of MC2→JMC0→MC4→JMC0→ . . . →JMC0→MCn-1. If the last data in the JMC0 is "0", the memory cells MC0, MC2, . . . , MCn-1 are written and read the data "0" correctly.

Then, the array control circuit 200 performs the operation for writing the data "1" stored in the judgment memory cell JMC2 to the memory cell MC0, MC2, . . . , MCn-1 in this order. That is, the "1" value data stored in the judgment memory cell JMC2 is written in the order of MC0→JMC2→MC2→JMC2→ . . . →JMC2→MCn-1. If the last data in the JMC2 is "1", the memory cells MC0, MC2, . . . , MCn-1 are written and read the data "1" correctly.

Then, the same operation is performed in the memory cells MC1, MC3, . . . , MCn which are connected to the bit line BLb.

Figure 5:
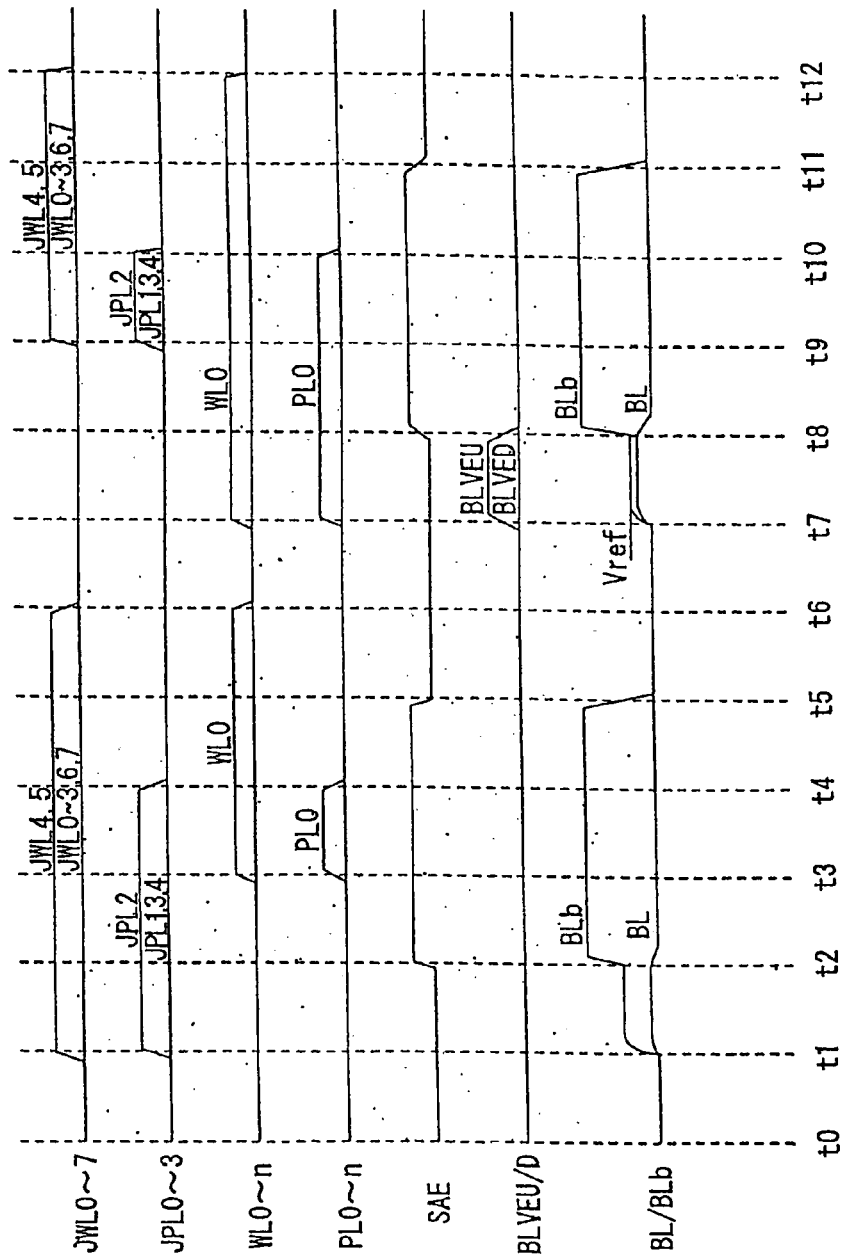
FIG. 5 is a timing chart showing a redundancy test operation of the ferroelectric memory device of the first embodiment.

First, the data "0" stored in the judgment memory cell JMC5 is written in the order of MC1→JMC5→MC3→JMC5→ . . . →JMC5→MCn. The timing chart of this operation is shown in FIG. 5. In the operation shown in FIG. 5, supplying the reference voltage Vref to the bit line BL and turning the judgment word lines JWL4, JWL5 and the judgment plate line JPL2 to the high level are different from the timing chart which is shown in FIG. 3. If the last data stored in the JMC5 is "0" value, the memory cells MC1, MC3, . . . , MCn are written and read the data "0" correctly.

Then, the data "1" stored in the judgment memory cell JMC7 is written in the order of MC1→JMC7→MC3→JMC7→ . . . →JMC7→MCn. If the last data stored in the JMC7 is "1" value, the memory cells MC1, MC3, . . . , MCn are written and read the data "1" correctly.

Then, the array control circuit 200 outputs the data stored in the judgment memory cells JMC0 to JMC7. First, the control line YSEL0 becomes the high level, and the gate transistors GT0 and GTh0 are turned on in response to the high level of the control line YSEL0. Then, the judgment word lines JWL0 and JWL1 and the judgment plate line JPL0 become the high level, and the data stored in the judgment memory cells JMC0 and JMC1 are outputted to the digit lines DB and DBb. Then, the judgment word lines JWL0 and JWL1 and the judgment plate line JPL0 are turned to the low level, and the judgment word lines JWL2 and JWL3 and the judgment plate line JPL2 are turned to the high level. As a result, the data stored in the judgment memory cells JMC2, JMC3 are outputted to the digit lines DB and DBb. Also, the data stored in the judgment memory cells JMC4 and JMC5 and the data stored in the judgment memory cells JMC6 and JMC7 are outputted to the digit lines DB and DBb.

Finally, an external testing equipment tests the memory cells MC0 to MCn by comparing the outputted data from the judgment memory cells JMC0 to JMC7 with the original data. If the defective memory cell is found, the memory cell row that includes the defective memory cell is changed to the redundant memory cell row.

In this embodiment, the quality of the memory cells MC0 to MCn are tested based on the eight judgment memory cells JMC0 to JMC7. As a result, the external testing equipment can test the ferroelectric memory device without checking all the memory cells.

Further, in this embodiment, since the judgment word lines JWL0 to JWL7 are operated so that the pair of the judgment memory cells JMC0 and JMC1, the pair of the judgment memory cells JMC2 and JMC3, the pair of the judgment memory cells JMC4 and JMC5, and the pair of the judgment memory cells JMC6 and JMC7 are operated as 2T/2C type judgment memory cells. Therefore, when the data are read from the judgment memory cells JMC0, JMC2, JMC4 and JMC6, a voltage outputted from the judgment memory cells JMC1, JMC3, JMC5 and JMC7 are used as the reference voltage. The reference voltage Vref is a middle level between the high level and the low level. The voltage outputted from the judgment memory cells JMC1, JMC3, JMC5 and JMC7 are the high level or the low level. Therefore, the voltage between the bit line BL and the bit line BLb becomes to double as compared to the 1T/1C type structure is used as the judgment transistor. As a result, when the data is transferred repeatedly between the judgment memory cells and the memory cells, a reliability of the stored data can be maintained.

Further, in this embodiment, two 1T/1C type judgment memory cells pair is operated simultaneously for using as 2T/2C type memory cell. Therefore, a structure of the judgment memory cell is the same as a structure of the memory cell. As a result, it is easy to design and produce the ferroelectric memory device. Also, since the memory cells in the memory cell portion 110 are 1T/1C type memory cell, a chip size of the ferroelectric memory device is maintained small.

In the redundancy test, the normal operation of judgment memory cells JMC0 to JMC7 is needed. Therefore, the judgment memory cells JMC0 to JMC7 are tested by the conventional way before the redundancy test.

Second Preferred Embodiment

Then an improved array control circuit is described as a second embodiment of the present invention.

Figure 6:
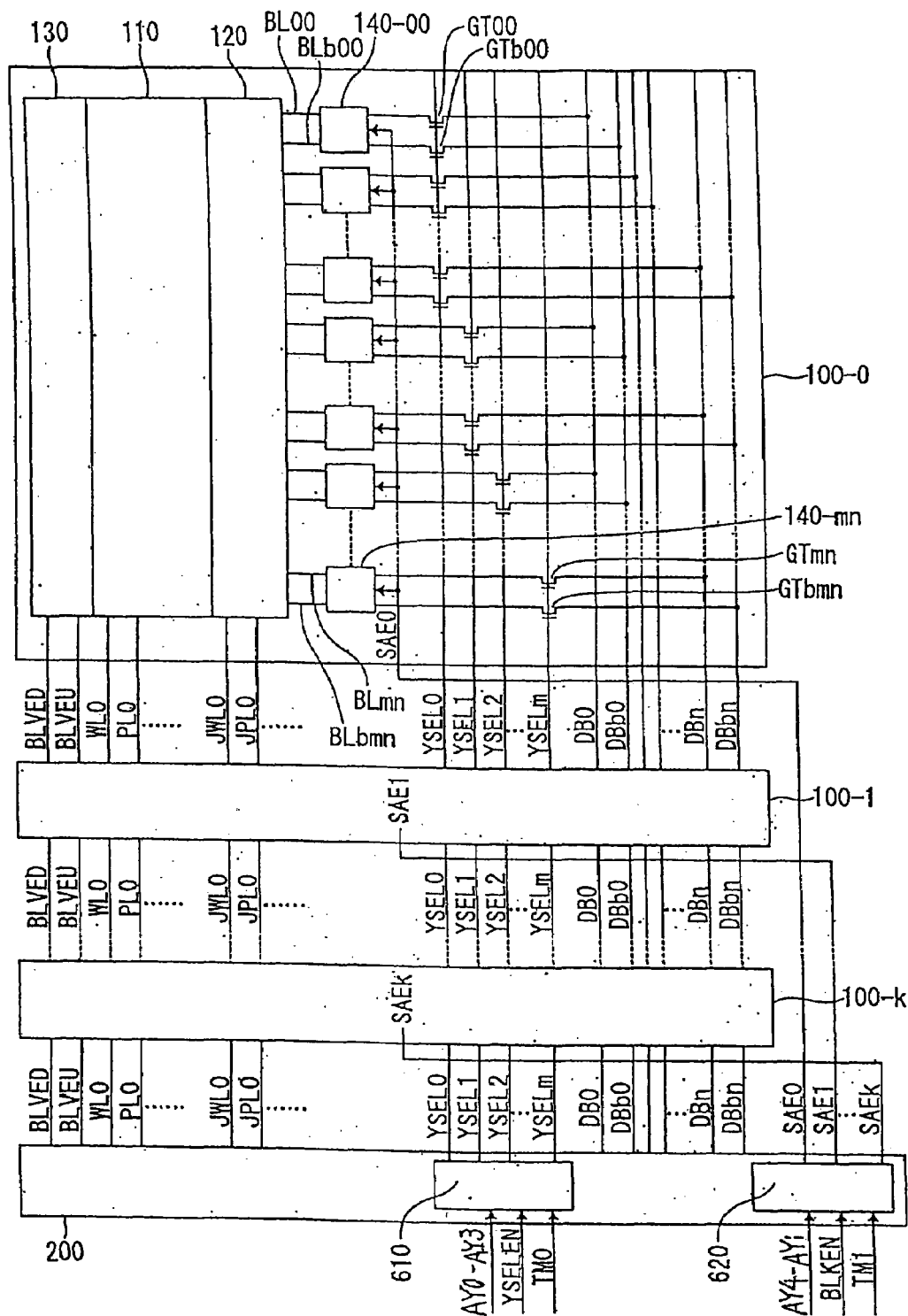
FIG. 6 is a schematic diagram showing a ferroelectric memory circuit of a second embodiment of the present invention.

FIG. 6 is a schematic diagram showing a ferroelectric memory circuit of a second embodiment of the present invention. The ferroelectric memory device shown in FIG. 6 has an YSEL control circuit 610 and a SAE control circuit 620 in the array control circuit 200.

FIG. 7(A) is a schematic diagram showing the YSEL control circuit 610. FIG. 7(B) is a schematic diagram showing the SAE control circuit 620. In FIGS. 7(A) and (B), column lower addresses are referred by AY0 to AY3 and column upper addresses are referred by AY4 to AYi.

The YSEL control circuit 610 includes AND gates 611-0 to 611-m and inverters 612 and 613-0 to 613-3 as shown in FIG. 7(A).

The AND gates 611-0 to 611-m input an inverted test mode signal TM0, an YSEL enable signal YSELEN, the column lower addresses AY0 to AY3 and an inverted signal of the column lower addresses AY0 to AY3. The inverter 612 inverts the test mode signal TM0. The inverters 613-0 to 613-3 invert the column lower addresses AY0 to AY3 respectively.

When the test mode signal TM0 is the high level, the YSEL control circuit 610 turns all the output signals YSEL0 to YSELm to the low level independently of the level of the other signals. Therefore, in the redundancy test operation, the gate transistors GT00 to Gtmn, GTh00 to GThmn are turned off, and the sense amplifiers 140-00 to 140-mn are separated to the digit lines DB0 to DBn and DBb0 to DBbn.

In the normal operation, the test mode signal TM0 is the low level. Therefore, the YSEL control circuit 610 changes the voltage of the YSEL0 to YSELm in response to the level of the column lower addresses AY0 to AY3.

The SAE control circuit 620 includes AND gates 621-0 to 621-k, OR gates 622-0 to 622-k and inverters 623-0 to 623-i as shown in FIG. 7(B).

The AND gates 621-0 to 621-k input a BLK enable signal BLKEN, the column upper addresses AY4 to AYi and inverted signals of the column upper address AY4 to AYi. The OR gates 622-0 to 622-k output the logical OR between the test mode signal TM1 and the output signal of the AND gates 621-0 to 621-k. The inverters 623-0 to 623-i invert the column upper addresses AY4 to AYi.

When the test mode signal TM1 is the high level, the SAE control circuit 620 turns all the output signals SAE0 to SAEk to the high level independently of the level of the other signals. Therefore, in the redundancy test operation, the sense amplifiers 140-0 to 140-mn in all the array blocks 100-0 to 100-k start to operation simultaneously.

In the normal operation, the test mode signal TM1 is the low level. Therefore, the SAE control circuit 620 changes the voltage of the SAE0 to SAEk in response to the column upper addresses AY4 to AYi.

In this embodiment, setting the test mode signal TM0 to the high level can turn off all the gate transistors GT00 to GTmn, and setting the test mode signal TM1 to the high level can operate all the sense amplifiers 140-0 to 140-mn simultaneously, independently of the level of the column address. Therefore, the redundancy test for all the memory cell rows can be performed simultaneously.

Third Preferred Embodiment

Figure 8:
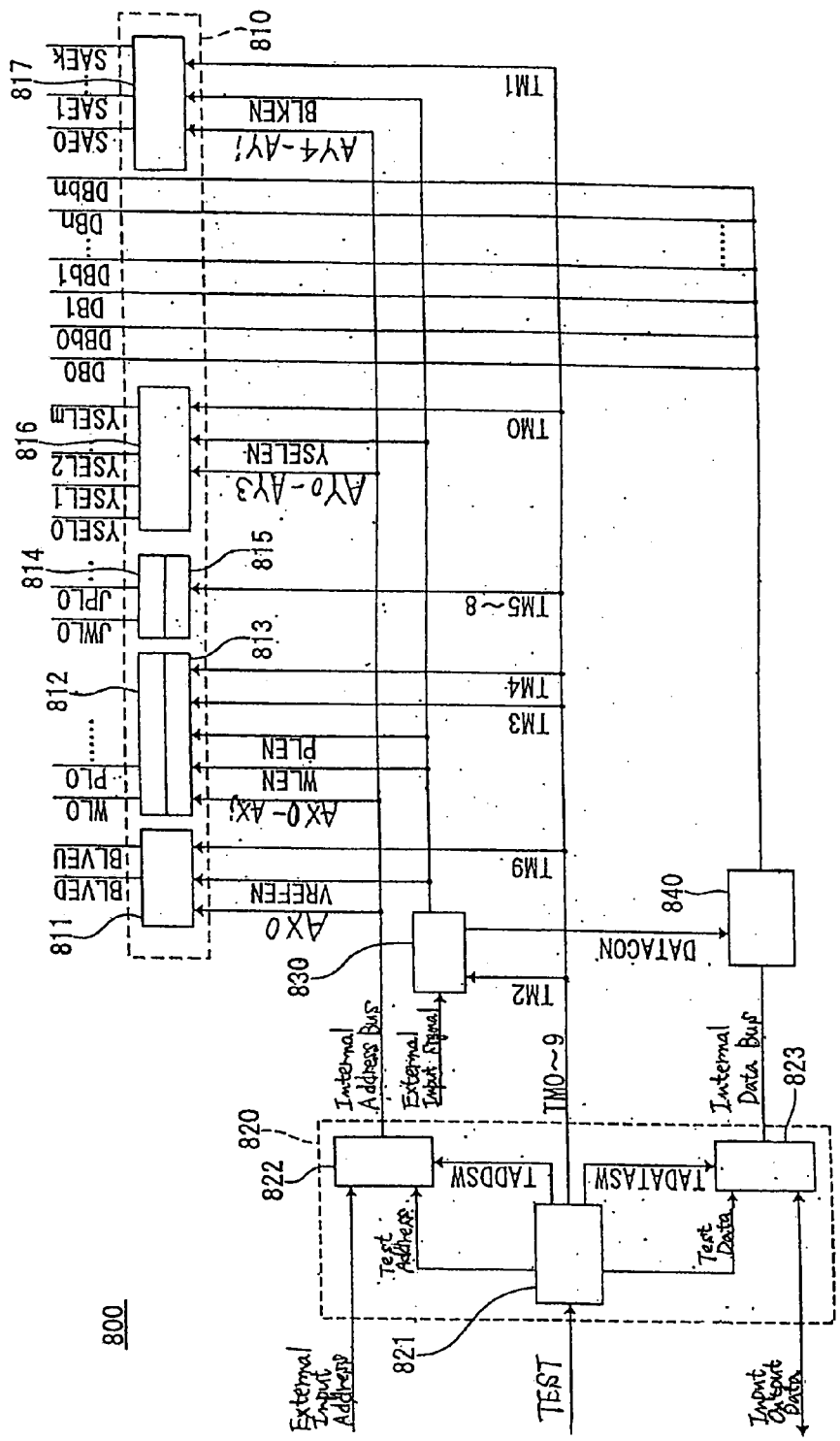
FIG. 8 is a schematic diagram showing a ferroelectric memory circuit of a third embodiment of the present invention.
Figure 9A:
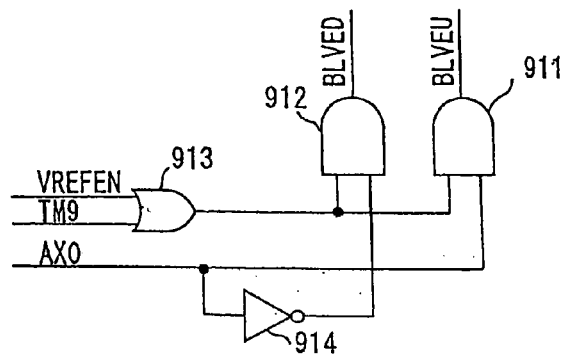
FIG. 9(A) is a schematic diagram showing a reference voltage controlling circuit.
Figure 9B:
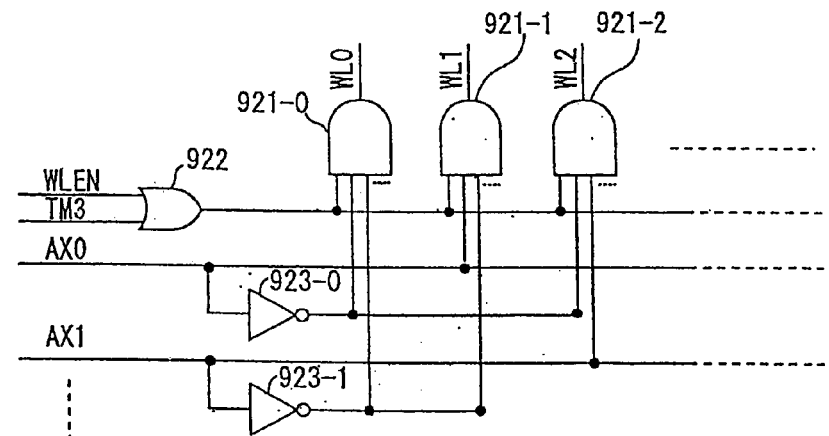
FIG. 9(B) is a schematic diagram showing a word line driver.
Figure 9C:
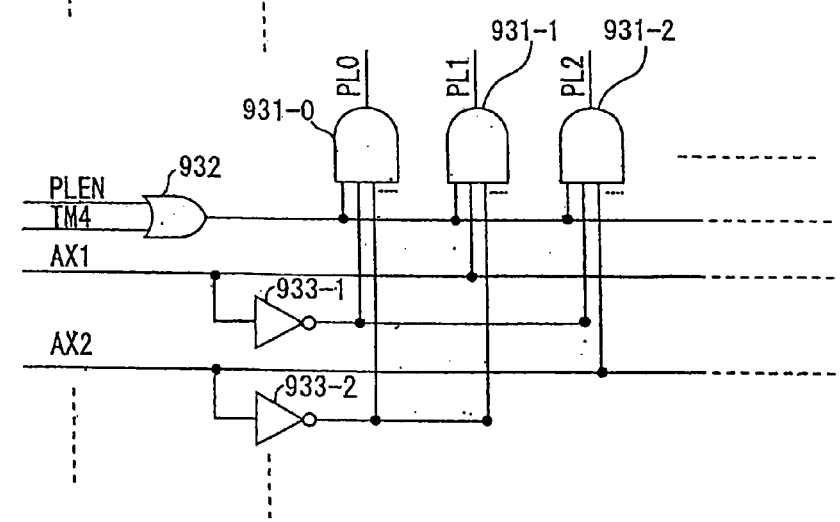
FIG. 9(C) is a schematic diagram showing a plate line driver.
Figure 10A:
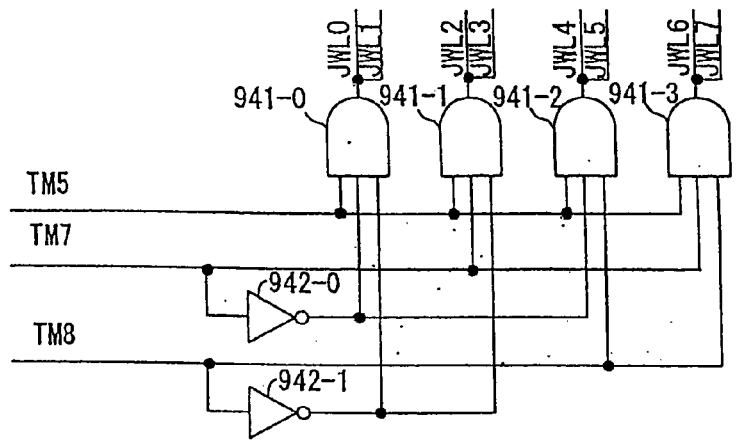
FIG. 10(A) is a schematic diagram showing a judgment word line driver.
Figure 10B:
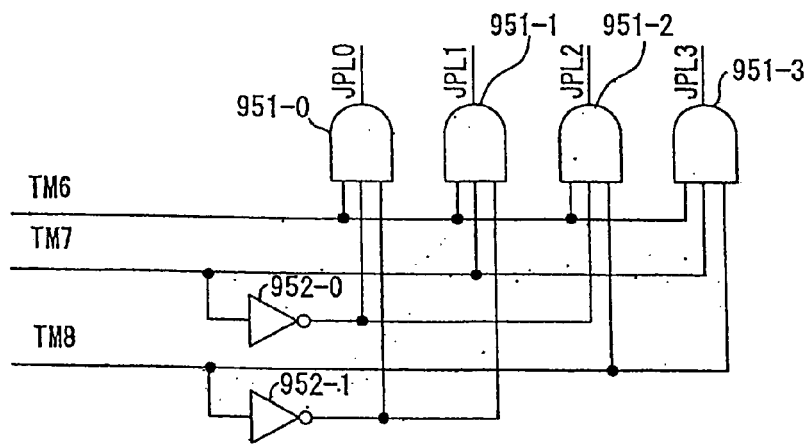
FIG. 10(B) is a schematic diagram showing a judgment plate line driver.

FIG. 8 is a schematic diagram showing a ferroelectric memory circuit of a third embodiment of the present invention. FIG. 9(A) is a schematic diagram showing a reference voltage controlling circuit 811. FIG. 9(B) is a schematic diagram showing a word line driver 812. FIG. 9(C) is a schematic diagram showing a plate line driver 813. FIG. 10(A) is a schematic diagram showing a judgment word line driver 814. FIG. 10(B) is a schematic diagram showing a judgment plate line driver 815. In a third embodiment, a structure of a peripheral circuit is different from that of the first embodiment.

The ferroelectric memory of this embodiment includes an array control circuit 810, a test pattern generating circuit 820, control logic circuit 830 and a data control circuit 840 as shown in FIG. 8.

The array control circuit 810 includes the reference voltage control circuit 811, the word line driver 812, the plate line driver 813, the judgment word line driver 814, the judgment plate line driver 815, an YSEL control circuit 816 and an SAE control circuit 817.

The reference voltage control circuit 811 includes AND gates 911, 912, an OR gate 913 and an inverter 914 as shown in FIG. 9(A). The AND gate 911 outputs a logical AND of an output signal of the OR gate 913 and row address AX0. The AND gate 912 outputs a logical AND of an output signal of the OR gate 913 and an inverted signal of the row address AX0. The OR gate 913 outputs a logical OR of a reference voltage enable signal VREFEN and a test mode signal TM9. The inverter 914 outputs the inverted signal of the row address AX0. In the reference voltage control circuit 811, when the reference voltage enable signal VREFEN or the test mode signal TM9 is turned to the high level, one of the reference voltage control signals BLVEU and BLVED is turned the high level in response to the level of the row address AX0.

The word line driver 812 includes AND gates 921-0 to 921-n, an OR gate 922 and inverters 923-0 to 923-j as shown in FIG. 9(B). The AND gates 921-0 to 921-n input an output signal of the OR gate 922, row addresses AX0 to AXj and inverted signals of the row addresses AX0 to AXj. The OR gate 922 outputs a logical OR of a word line enable signal WLEN and a test mode signal TM3. The inverters 923-0 to 923-j invert the row addresses AX0 to AXj. In the word line driver 812, when the word line enable signal WLEN or the test mode signal TM3 is turned to the high level, one of the word lines WL0 to WLn is turned to the high level in response to the level of the row addresses AX0 to AXj.

The plate line driver 813 includes AND gates 931-0 to 931-n, an OR gate 932 and inverters 933-1 to 933-j as shown in FIG. 9(C). The AND gates 931-0 to 931-n input an output signal of the OR gate 932, the row addresses AX1 to AXj and the inverted signal of the row addresses AX1 to AXj. The OR gate 932 outputs a logical OR of a plate line enable signal PLEN and a test mode signal TM4. The inverters 933-1 to 933-j invert the row addresses AX1 to AXj. In the plate line driver 813, when the plate line enable signal PLEN or the test mode signal TM4 is turned to the high level, one of the plate line PL0 to PLm is turned to the high level in response to the row addresses AX1 to AXj.

The word line driver 814 includes AND gates 941-0 to 941-3 and inverters 942-0, 942-1 as shown in FIG. 10(A). The AND gates 941-0 to 941-3 inputs a test mode signal TM5, test mode signals TM7 and TM8, and inverted signals of the test mode signals TM7 and TM8. Each of the AND gates 941-0 to 941-3 is connected to two judgment word lines respectively for operating the two 1T/1C type judgment memory cells as one 2T/2C type memory cell. The inverters 942-0 and 942-1 invert the test mode signals TM7 and TM8. In the judgment word line driver 814, when the test mode signal TM5 is turned to the high level, one pair of the judgment word line pairs JWL0 and JWL1, JWL2 and JWL3, JWL4 and JWL5, and JWL6 and JWL7 is turned to the high level in response to the level of test mode signals TM7 and TM8.

The judgement plate line driver 815 includes AND gates 951-0 to 951-3 and inverters 952-0 and 952-1. The AND gates 951-0 to 951-3 have input thereto a test mode signal TM6, the test mode signals TM7 and TM8 and the inverted signal of the test mode signals TM7 and TM8. The inverters 952-0 and 952-1 invert the test mode signals TM7 and TM8. In the judgement plate line driver 815, when the test mode signal TM6 is turned to the high level, one of the judgement plate lines JPL0 to JPL3 is turned to the high level in response to the level of the test mode signals TM7 and TM8.

Figure 7:
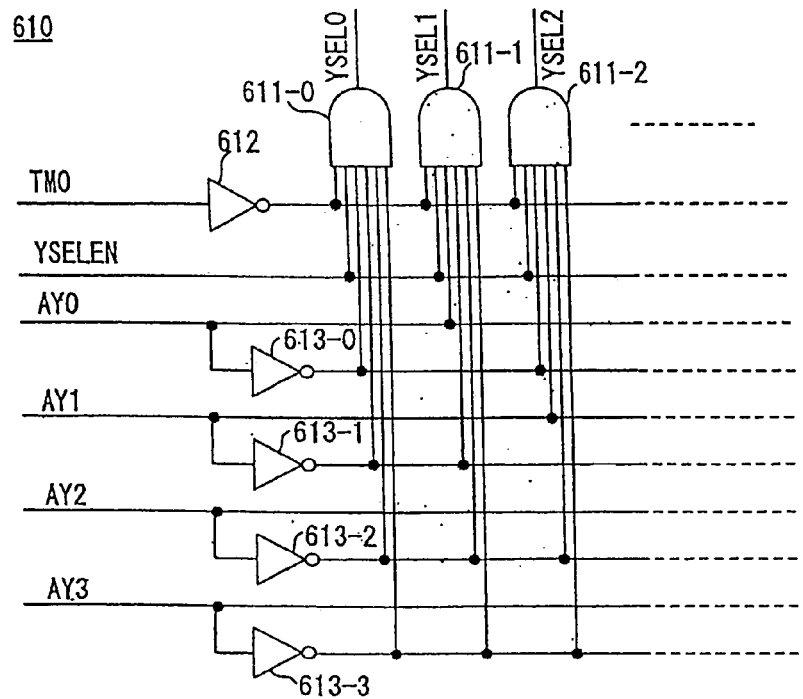
FIG. 7(A) is a schematic diagram showing an YSEL control circuit.
FIG. 7(B) is a schematic diagram showing a SAE control circuit.
Figure 7:
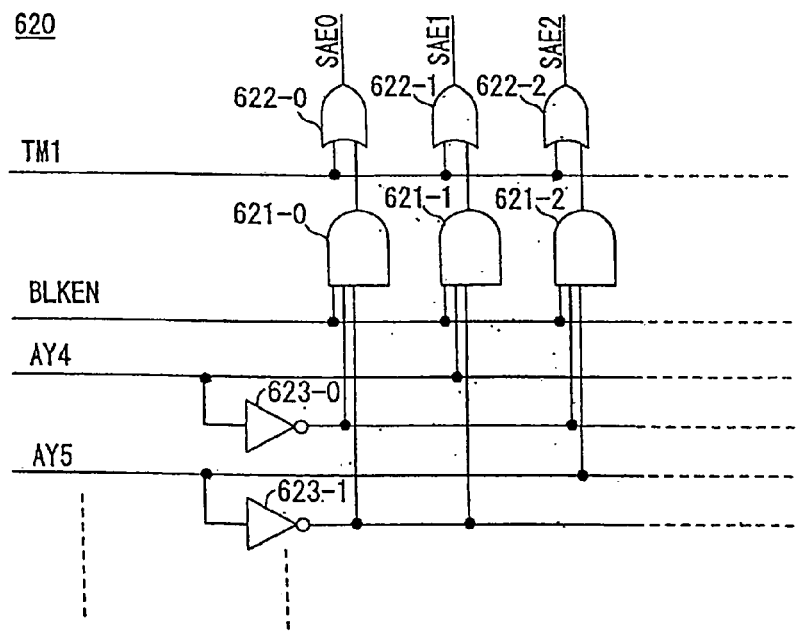

A structure of the YSEL control circuit 816 and the SAE control circuit 817 is the same as the structure of the YSEL control circuit 610 and the SAE control circuit 620 of the second embodiment which is shown in FIG. 7.

The test pattern generating circuit 820 includes a pattern generator 821, an address switching circuit 822 and a data switching circuit 823. The pattern generator 821 generates the test mode signals TM0 to TM9, a test address, a test data, an address switching signal TADDSW and a data switching signal TADATASW as shown in FIG. 8. The address switching circuit 822 connects one of an address input port (not shown) of the ferroelectric memory device and the pattern generator 821 to an internal address bus in response to the address switching signal TADDSW. The data switching circuit 823 connects one of the data input output port (not shown) of the ferroelectric memory device and the pattern generator to the internal data bus in response to the data switching signal TDATASW The control logic circuit 830 generates a data control signal DATACON and each of enable signals VREFEN, WLEN, PLEN, YSELEN and BLKEN in response to the test mode signal TM2 and the input signal.

The data control circuit 840 outputs the data on the digit lines DB0 to DBn and DBb0 to DBbn to the internal data bus, and the data on the data bus to the digit line DB0 to DBn and DBb0 to DBbn.

Then, an operation of the peripheral circuit shown in FIGS. 8 to 10 is described. In a normal operation, the external input test signal TEST is set to the low level. Therefore, the pattern generator 821 set the test mode signals TM0 to TM9 to the low level, and the address switching signal TADDSW and the data switching signal TDATASW to the low level. The address switching circuit 822 connects the internal address bus to the address input port, and the data switching circuit 823 connects the internal data bus to the data input output port. Since the test mode signal TM2 is the low level, the control logic circuit 830 generates the data control signal DATACON and each enable signals VREFEN, WLEN, PLEN, YSELEN and BLKEN in response to the external input signal. The reference voltage control circuit 811 turns one of the signals BLVEU and BLVED to the high level, the word line driver 812 turns one of the word lines WL0 to WLn to the high level, the plate line driver 813 turns one of the plate line PL0 to PLn to the high level, and the SAE control circuit 817 turns one of the control lines SAE0 to SAEk to the high level, in response to the enable signals VREFEN, WLEN, PLEN, YSELEN and BLKEN and the address signals. In above operation, the data is written to the memory cell and read from the memory cell of the desired address.

In the testing operation, the external input test signal TEST is set to the high level. The pattern generator 821 set the address switching signal TADDSW and the data switching signal TDATASW to the high level. The address switching circuit 822 and the data switching circuit 823 connect the internal address bus and the internal data bus to the pattern generator 821. The pattern generator 821 begins to generate the test mode signals TM0 to TM9, the test address and the test data. In the test operation, the control logic circuit 830 does not generate the enable signals VREFEN, WLEN, PLEN, YSELEN and BLKEN. Each circuit 811 to 817 in the array control are operated in response to the test mode signals TM3 to TM6 and TM9. The test for writing and reading is performed the same as the test of the first embodiment. After the test, the data stored in the judgment memory cells JMC0 to JMC7 are transferred to the external testing equipment through the digit lines DB0 to DBn and DBb0 to DBbn, the data control circuit 840 and the data switching circuit 823, and the quality of the ferroelectric memory device is judged.

In this embodiment, the external testing equipment output only one external input signal TEST for testing the ferroelectric memory device. As a result, the ferroelectric memory device can be tested by the external testing equipment which has simple structure. Also, since the number of the test pad on the chip can be reduced, the size of the chip can be reduced.

While the preferred form of the present invention has been described, it is to be understood that modifications will be apparent to those skilled in the art without departing from the spirit of the invention. The scope of the invention is to be determined solely by the following claims.

What is claimed is:

1. A ferroelectric memory device, comprising:
   a first bit line;
   a second bit line;
   a plurality of first memory cells each of which is connected to the first bit line, wherein each of the first memory cells includes one transistor and one ferroelectric capacitor;
   a plurality of second memory cells each of which is connected to the second bit line, wherein each of the second memory cells includes one transistor and one ferroelectric capacitor;
   a plurality of word lines each of which is connected to a respective one of the first and second memory cells;
   a plurality of plate lines each of which is commonly connected to respective pairs of the first and second memory cells;
   a plurality of judgement memory cells each of which is connected between the first bit line and the second bit line, wherein each of the judgement memory cells includes two transistors and two ferroelectric capacitors; and
   a plurality of judgement word line pairs each of which is connected to a respective one of the judgement memory cells, and wherein the judgement word lines of a respective ijudgement word line pair are supplied with a common voltage level.

2. The ferroelectric memory device of claim 1, further comprising a plurality of judgement plate lines each connected to respective ones of the judgement memory cells.

3. The ferroelectric memory device of claim 2, wherein each of the judgement memory cells includes:
   a first transistor which has a gate electrode connected to one judgement word line of a respective judgement word line pair, a first electrode connected to the first bit line and a second electrode;
   a first capacitor connected between a respective judgement plate line and the second electrode of the first transistor;
   a second transistor which has a gate electrode connected to an other judgement word line of the respective judgement word line pair, a first electrode connected to the second bit line and a second electrode; and
   a second ferroelectric capacitor connected between the respective judgement plate line and the second electrode of the second transistor.

4. The ferroelectric memory device of claim 3, wherein each of the first memory cells includes a third transistor which has a gate electrode connected to a respective word line, a first electrode connected to the first bit line and a second electrode, and a third capacitor connected between a respective plate line and the second electrode of the third transistor, and
   wherein each of the second memory cells includes a fourth transistor which has a gate electrode connected to the respective word line, a first electrode connected to the second bit line and a second electrode, and a fourth capacitor connected between the respective plate line and the second electrode of the fourth transistor.

5. The ferroelectric memory device of claim 1, further comprising a plurality of digit line pairs and a plurality of gate transistor pairs, wherein each of the gate transistor pairs connects a sense amplifier to a respective digit line pair.

6. A ferroelectric memory device, comprising:
   a memory cell array which includes a plurality of first ferroelectric memory cells, wherein each first ferroelectric memory cell has a structure of one transistor and one capacitor;
   a judgement memory cell array which includes a plurality of second ferroelectric memory cells, wherein each second ferroelectric memory cell has a structure of two transistors and two capacitors;
   a pair of bit lines; and
   a plurality of judgement word line pairs, each of the judgement word line pairs being connected to respective ones of the second ferroelectric memory cells, wherein judgement word lines of a respective judgement word line pair are supplied with a same voltage level.
   wherein the first ferroelectric memory cells in the memory cell array are alternatively connected to different bit lines of the bit line pair, and wherein the second ferroelectric memory cells in the judgement memory cell array are each connected to both bit lines of the bit line pair.

7. A ferroelectric memory comprising:
   a memory cell array coupled to a bit line pair and including a plurality of memory cells, each of the memory cells having one transistor and one ferroelectric capacitor;
   a judgement memory cell array coupled to the bit line pair and including a plurality of judgement memory cells, each of the judgement memory cells having first and second transistors and first and second ferroelectric capacitors; and
   a plurality of judgement word line pairs, the judgement word line pairs being connected to respectively different ones of the judgement memory cells, and judgement word lines of respective judgement word line pairs are connected together.

8. The ferroelectric memory of claim 7, further comprising a plurality of judgement plate lines coupled to respectively different ones of the judgement memory cells.

9. The ferroelectric memory of claim 8, wherein each of the judgement memory cells is configured so that:
   the first transistor has a first electrode connected to a first bit line of the bit line pair, a gate connected to a first judgement word line of a corresponding judgement word line pair, and a second electrode,
   the first ferroelectric capacitor has a first electrode connected to the second electrode of the first transistor, and a second electrode connected to a corresponding judgement plate line,
   the second ferroelectric capacitor has a first electrode connected to the corresponding judgement plate line, and a second electrode, and
   the second transistor has a first electrode connected to the second electrode of the second ferroelectric capacitor, a gate connected to a second judegment word line of the corresponding judgement word line pair, and a second electrode connected to a second bit line of the bit line pair.

10. The ferroelectric memory of claim 7, wherein the memory cells include a plurality of first memory cells each connected to a first bit line of the bit line pair, and a plurality of second memory cells each connected to a second bit line of the bit line pair,
   the first and second memory cells are coupled to respectively different word lines, and
   respective pairs of the first and second memory cells are connected to respectively different plate lines.

11. The ferroelectric memory of claim 10, wherein each of the first memory cells is configured so that the one transistor has a first electrode connected to the first bit line, a gate connected to one of the word lines, and a second electrode, and
   the one ferroelectric capacitor has a first electrode connected to the second electrode of the one transistor, and a second electrode connected to one of the plate lines.

12. The ferroelectric memory of claim 10, wherein each of the second memory cells is configured so that the one transistor has a first electrode connected to the second bit line, a gate connected to one of the word lines, and a second electrode, and
   the one ferroelectric capacitor has a first electrode connected to the second electrode of the one transistor, and a second electrode connected to one of the plate lines.

* * * * *